(12) United States Patent
Yamada et al.

(10) Patent No.: US 9,401,333 B2
(45) Date of Patent: Jul. 26, 2016

(54) SEMICONDUCTOR DEVICE

(71) Applicant: Kabushiki Kaisha Toshiba, Minato-ku (JP)

(72) Inventors: Keiju Yamada, Kanagawa-ken (JP); Masaaki Ishida, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/801,404

(22) Filed: Jul. 16, 2015

(65) Prior Publication Data

US 2015/0325530 A1 Nov. 12, 2015

Related U.S. Application Data

(60) Continuation of application No. 14/552,633, filed on Nov. 25, 2014, now Pat. No. 9,123,731, which is a division of application No. 14/294,931, filed on Jun. 3, 2014, now Pat. No. 8,952,505, which is a division of application No. 13/357,866, filed on Jan. 25, 2012, now Pat. No. 8,860,190.

(30) Foreign Application Priority Data

Jan. 31, 2011 (JP) .................................. 2011-019273

(51) Int. Cl.
*H01L 23/552* (2006.01)
*H01L 23/31* (2006.01)
(Continued)

(52) U.S. Cl.
CPC ............ *H01L 23/552* (2013.01); *H01L 21/561* (2013.01); *H01L 23/3107* (2013.01);
(Continued)

(58) Field of Classification Search
CPC ....... H01L 23/552; H01L 23/48; H01L 23/40; H01L 23/52; H01L 23/5226; H01L 23/49805

USPC ................................. 257/659, 737–738, 660
See application file for complete search history.

(56) References Cited

U.S. PATENT DOCUMENTS 8,084,300 B1 * 12/2011 San Antonio ......... H01L 21/561
257/E21.602
9,111,945 B2 * 8/2015 Tsai ...................... H01L 23/552
(Continued)

FOREIGN PATENT DOCUMENTS

CN 1774804 A 5/2006
CN 101578697 A 11/2009
(Continued)

OTHER PUBLICATIONS

Japanese Office Action issued Jan. 7, 2013 in Patent Application No. 2011-019273 (w/English translation).
(Continued)

*Primary Examiner* — Hoa B Trinh
(74) *Attorney, Agent, or Firm* — Oblon, McClelland, Maier & Neustadt, L.L.P

(57) ABSTRACT

According to one embodiment, a semiconductor device includes a circuit substrate, a semiconductor element, a sealing resin layer, and a conductive shielding layer. The circuit substrate includes an insulating layer, a plurality of interconnections forming first interconnection layers provided on an upper surface side of the insulating layer, a plurality of interconnections forming second interconnection layers provided on a lower surface side of the insulating layer, and a plurality of vias penetrating from the upper surface to the lower surface of the insulating layer. The semiconductor element is mounted on the upper surface side of the circuit substrate. The conductive shielding layer covers the sealing resin layer and part of an end portion of the circuit substrate. Any of the plurality of vias and the conductive shielding layer are electrically connected.

7 Claims, 8 Drawing Sheets

(51) Int. Cl.
*H01L 23/498* (2006.01)
*H01L 23/528* (2006.01)
*H01L 21/56* (2006.01)
*H01L 23/522* (2006.01)
*H01L 23/50* (2006.01)
*H01L 23/00* (2006.01)

(52) U.S. Cl.
CPC .... *H01L23/49805* (2013.01); *H01L 23/49811* (2013.01); *H01L 23/49838* (2013.01); *H01L 23/50* (2013.01); *H01L 23/5226* (2013.01); *H01L 23/5286* (2013.01); *H01L 24/97* (2013.01); *H01L 23/3128* (2013.01); *H01L 24/32* (2013.01); *H01L 24/45* (2013.01); *H01L 24/48* (2013.01); *H01L 24/73* (2013.01); *H01L 24/85* (2013.01); *H01L 2224/32225* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/48228* (2013.01); *H01L 2224/48644* (2013.01); *H01L 2224/48655* (2013.01); *H01L 2224/48744* (2013.01); *H01L 2224/48755* (2013.01); *H01L 2224/48844* (2013.01); *H01L 2224/48855* (2013.01); *H01L 2224/73265* (2013.01); *H01L 2224/85444* (2013.01); *H01L 2224/85455* (2013.01); *H01L 2224/97* (2013.01); *H01L 2924/01013* (2013.01); *H01L 2924/01028* (2013.01); *H01L 2924/01047* (2013.01); *H01L 2924/01079* (2013.01); *H01L 2924/15311* (2013.01); *H01L 2924/181* (2013.01); *H01L 2924/3025* (2013.01)

(56) References Cited

U.S. PATENT DOCUMENTS

| | | |
|---|---|---|
| 2001/0008301 A1 | 7/2001 | Terui |
| 2009/0084586 A1 | 4/2009 | Nielsen |
| 2009/0302436 A1 | 12/2009 | Kim et al. |
| 2012/0015687 A1 | 1/2012 | Yamada et al. |

FOREIGN PATENT DOCUMENTS

| | | |
|---|---|---|
| CN | 101635281 A | 1/2010 |
| JP | 8-250890 | 9/1996 |
| JP | 2004-095607 | 3/2004 |
| JP | 2004-172176 | 6/2004 |
| JP | 2004-214584 | 7/2004 |
| JP | 2004-297456 | 10/2004 |
| JP | 2005-341489 | 12/2005 |
| JP | 2006-173493 | 6/2006 |
| JP | 2008-166837 | 7/2008 |
| JP | 2009-88338 | 4/2009 |
| JP | 2010-103574 | 5/2010 |
| JP | 2010-118592 | 5/2010 |
| JP | 2010-226137 | 10/2010 |
| TW | 201008478 A1 | 2/2010 |
| TW | 201101452 A1 | 1/2011 |
| WO | WO 2004/093505 A2 | 10/2004 |
| WO | WO 2004/093505 A3 | 10/2004 |

OTHER PUBLICATIONS

Office Action issued Dec. 13, 2013 in Japanese Patent Application No. 2011-019273 (w/English translation).
Office Action and Search Report issued on Jan. 2, 2014 in the counterpart Chinese Patent Application No. 201210021621.9 (w/English translation).
Office Action issued Mar. 10, 2014 in Taiwanese Patent Application No. 101103103 (w/English translation).
Office Action mailed Jun. 16, 2014 in Japanese Application No. 2014-061706 (w/English translation).
Combined Office Action and Search Report issued Aug. 11, 2014 in Chinese Patent Application No. 201210021621.9 (w/English translation).
Office Action issued Oct. 31, 2014 in Japanese Patent Application No. 2014-061706 (w/English translation).
Office Action issued Dec. 24, 2014 in Chinese Patent Application No. 201210021621.9 (with English translation).
Office Action issued Mar. 13, 2015 in Japanese Patent Application No. 2014-061706 (with English language translation).
Office Action mailed Jan. 8, 2016 in Japanese Application No. 2015-018898 (w/English translation).
Chinese Office Action issued Mar. 30, 2016 in Chinese Application No. 201410252218.6 with English translation, 19 pages.

\* cited by examiner

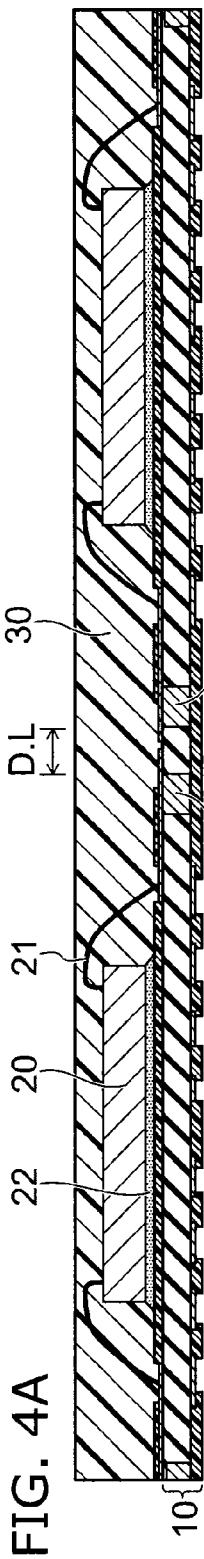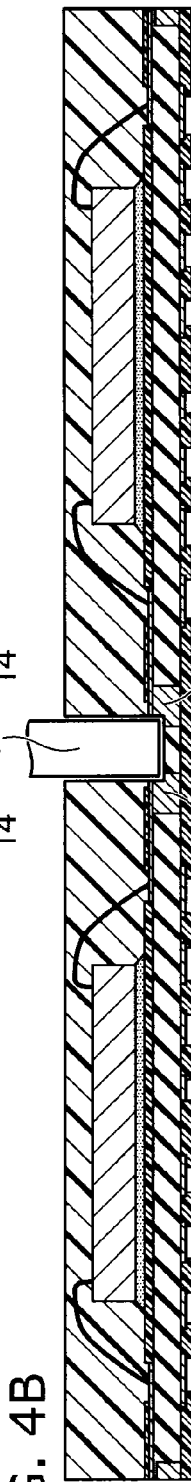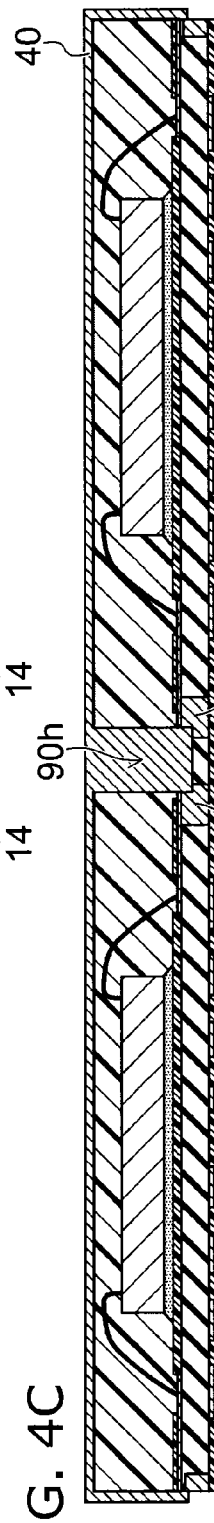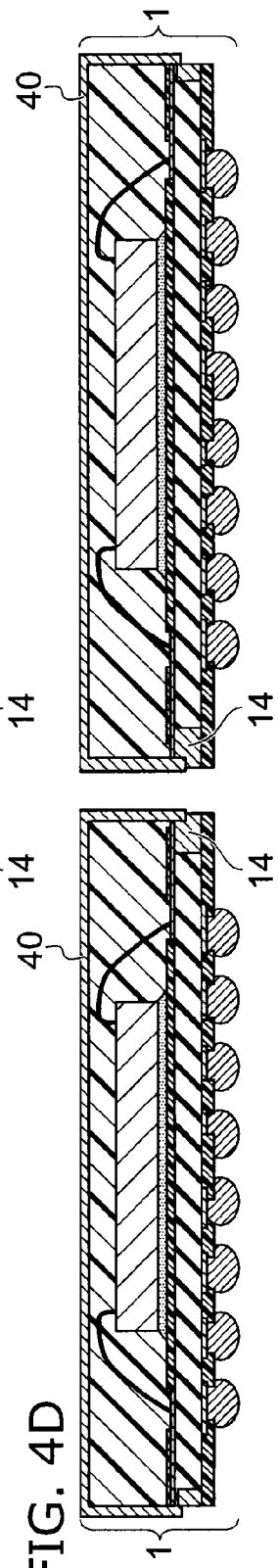

SEMICONDUCTOR DEVICE

CROSS-REFERENCE TO RELATED APPLICATIONS

This application is a continuation of and claims the benefit of priority under 35 U.S.C. §120 from U.S. Ser. No. 14/552,633 filed Nov. 25, 2014, which is a continuation of U.S. Ser. No. 14/294,931 filed Jun. 3, 2014 (now U.S. Pat. No. 8,952,505 issued Feb. 10, 2015), which is a division of U.S. Ser. No. 13/357,866 filed Jan. 25, 2012 (now U.S. Pat. No. 8,860,190 issued Oct. 14, 2014), and claims the benefit of priority under 35 U.S.C. §119 from Japanese Patent Application No. 2011-019273 filed Jan. 31, 2011; the entire contents of each of which are incorporated herein by reference.

FIELD

Embodiments described herein relate generally to a semiconductor device.

BACKGROUND

In general, when a current flows through a semiconductor element or a peripheral circuit, an electric field and a magnetic field are induced around the current to generate unnecessary electromagnetic noise. The unnecessary electromagnetic noise influences the operation of other circuits, elements, etc. As an example, there is a case where electromagnetic noise emitted from a semiconductor device mounted in mobile communication equipment such as a cellular phone is incident on the antenna to cause an interference with radio wave reception.

To shield such electromagnetic noise and protect the semiconductor element, there is a method in which a shield plate covering a circuit module is provided. However, the method in which the circuit module is covered with the shield plate may have difficulty in the downsizing of the circuit module.

In contrast, there is a semiconductor device (semiconductor package) in which a shield film is formed on the outer periphery of a semiconductor element itself. By installing such a semiconductor device in a circuit module, the circuit module can be downsized. Higher speed operation is required for the semiconductor element, and a highly reliable semiconductor device that shields electromagnetic noise more is desired.

BRIEF DESCRIPTION OF THE DRAWINGS

FIGS. 4A to 4D are schematic cross-sectional views for describing manufacturing processes for the semiconductor device according to the first embodiment;

DETAILED DESCRIPTION

Figure 1:
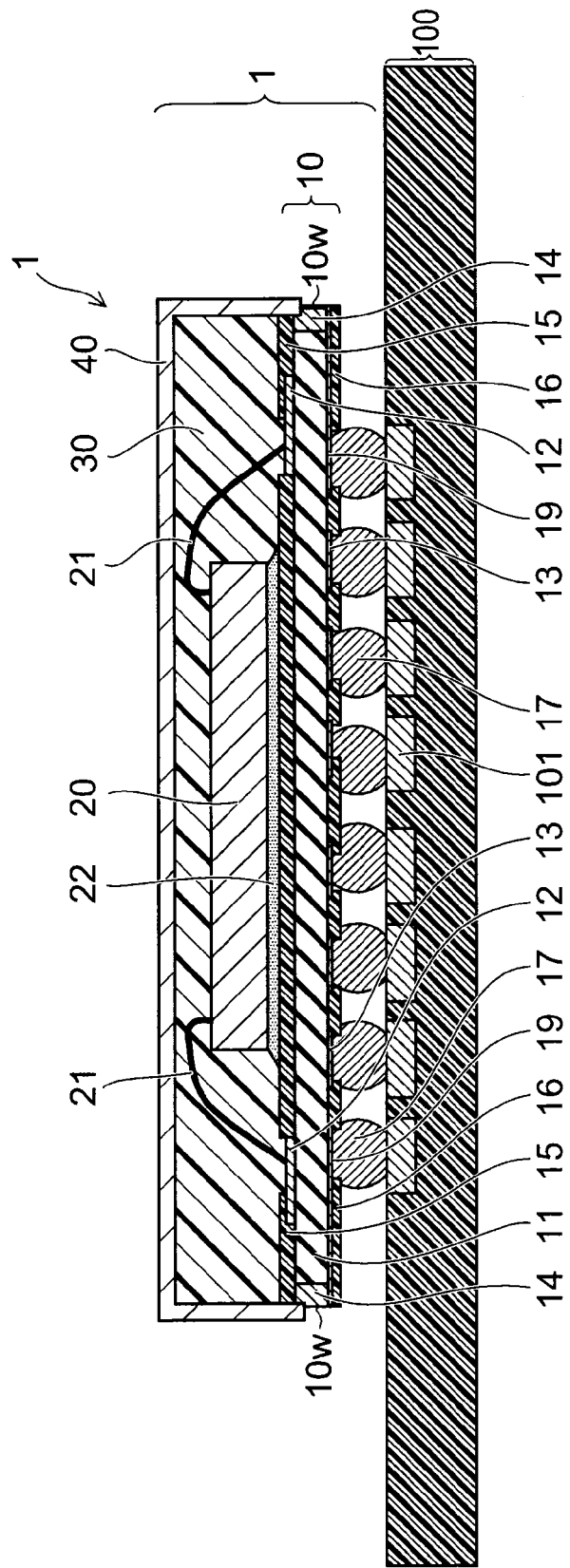
FIG. 1 is a schematic cross-sectional view for describing an overview of a semiconductor device according to a first embodiment.

In general, according to one embodiment, a semiconductor device includes a circuit substrate, a semiconductor element, a sealing resin layer, and a conductive shielding layer. The circuit substrate includes an insulating layer, a plurality of interconnections forming first interconnection layers provided on an upper surface side of the insulating layer, a plurality of interconnections forming second interconnection layers provided on a lower surface side of the insulating layer, and a plurality of vias penetrating from the upper surface to the lower surface of the insulating layer. The semiconductor element is mounted on the upper surface side of the circuit substrate. The sealing resin layer is provided on the upper surface of the circuit substrate and seals the semiconductor element. The conductive shielding layer covers the sealing resin layer and part of an end portion of the circuit substrate. Any of the plurality of vias and the conductive shielding layer are electrically connected. Any of the plurality of interconnections forming the second interconnection layers is electrically connected to an external connection terminal capable of becoming a ground potential.

In general, according to another embodiment, a semiconductor device includes a circuit substrate, a semiconductor element, a sealing resin layer, and a conductive shielding layer. The circuit substrate includes an insulating layer, a plurality of interconnections forming first interconnection layers provided on an upper surface side of the insulating layer, and a plurality of interconnections forming second interconnection layers provided on a lower surface side of the insulating layer. The semiconductor element is mounted on the upper surface side of the circuit substrate. The sealing resin layer is provided on the upper surface of the circuit substrate and seals the semiconductor element. The conductive shielding layer covers the sealing resin layer and part of an end portion of the circuit substrate. The plurality of interconnections forming the second interconnection layers is not in contact with the conductive shielding layer, electrically connected to any of the plurality of interconnections forming the first interconnection layers, and is drawn to an end of the circuit substrate so as to be exposed at a side surface of the circuit substrate.

Hereinbelow, embodiments are described with reference to the drawings. In the following description, identical components are marked with the same reference numerals, and a description of components once described is omitted as appropriate. The embodiments described below can be appropriately combined.

First Embodiment

FIG. 1 is a schematic cross-sectional view for describing an overview of a semiconductor device according to a first embodiment.

FIG. 1 shows a semiconductor device 1 according to the first embodiment and further a mounting substrate 100 on which the semiconductor device 1 is mounted.

The semiconductor device 1 is an FBGA (Fine pitch Ball Grid Array) semiconductor package. The semiconductor device 1 includes a circuit substrate 10. The circuit substrate 10 is also called an interposer substrate. The circuit substrate 10 includes an insulating layer 11, a plurality of interconnections 12 forming first interconnection layers provided on the outer periphery on the upper surface side of the insulating layer 11, and a plurality of interconnections 13 forming second interconnection layers provided on the lower surface side of the insulating layer 11. The circuit substrate 10 further includes a plurality of vias 14 penetrating from the upper surface (a first major surface) to the lower surface (a second major surface) of the insulating layer 11. A solder resist layer 15 covering part of the first interconnection layer 12 is formed on the upper surface of the circuit substrate 10. A solder resist layer 16 covering part of the second interconnection layer 13 is formed on the lower surface of the circuit substrate 10. Each of the plurality of interconnections 13 forming the second interconnection layers is a land-shaped interconnection layer. An external connection terminal 17 that is a solder ball is connected to each of the plurality of interconnections 13 forming the second interconnection layers. An extension line 19 extends from the external connection terminal 17 of the outer periphery to the outside of the circuit substrate 10. The extension line 19 is connected to the via 14 exposed at the side surface 10w of the circuit substrate 10. The extension line 19 is a connection line connecting the external connection terminal 17 of the outer periphery and the via 14 nearest to the external connection terminal 17 of the outer periphery. The external connection terminal 17 is connected to an interconnection layer 101 provided on the upper surface side of the mounting substrate 100.

A semiconductor element 20 is mounted on the upper surface side of the circuit substrate 10. One end of a wire (bonding wire) 21 is connected to the upper surface of the semiconductor element 20. The other end of the wire 21 is connected to the first interconnection layer 12. The wire 21 is an electrically conductive member, and electrically connects at least one of the plurality of interconnections 12 forming the first interconnection layers and an electrode (not shown) provided on the surface of the semiconductor element.

The outer periphery of the semiconductor element 20 and the wire 21 are sealed with a sealing resin layer 30 provided on the upper surface side of the circuit substrate 10. A die bonding material 22 is formed in the space between the semiconductor element 20 and the circuit substrate 10. The sealing resin layer 30 and part of the side surface 10w of the circuit substrate 10 are covered with a conductive shielding layer 40. The conductive shielding layer 40 is connected to the via 14 provided at the side surface (outer end) 10w of the circuit substrate 10. At least one of the vias 14 exposed at the side surface 10w of the circuit substrate 10 can be set at the ground (GND) potential. Thereby, the electric potentials of the outer periphery of the semiconductor element 20, the wire 21, the upper surface side of the circuit substrate 10, and the conductive shielding layer 40 covering part of the side surface 10w of the circuit substrate 10 can be set at the ground (GND) potential.

The semiconductor element 20 is, for example, a memory element such as a flash memory and DRAM, an operational element such as a microprocessor, a signal processing element, or the like. The material of the wire 21 is, for example, gold (Au), aluminum (Al), copper (Cu), and/or the like. The first interconnection layer 12 and the second interconnection layer 13 are copper (Cu) leaf, electrically conductive paste containing silver (Ag) and/or copper (Cu), or the like, and the surface is plated with nickel (Ni), gold (Au), and/or the like as necessary. The via 14 is, for example, a columnar electrode. The via 14 may be a columnar electrode in which all the components are made of electrically conductive material, or may have a configuration that includes, in addition to the columnar electrode, a circular cylindrical electrode in a cylindrical shape and a resin or the like embedded in the hollow space in the circular cylindrical electrode. The material of the via 14 is copper (Cu), tungsten (W), and/or the like.

The conductive shielding layer 40 is preferably made of a material with as low resistivity as possible in order to shield high-frequency noise emitted from the semiconductor element 20. As the material of the conductive shielding layer 40, for example, silver (Ag), copper (Cu), nickel (Ni), aluminum (Al), and/or the like are selected. More specifically, the conductive shielding layer 40 is a silver (Ag)-containing layer with silver (Ag) paste cured, and the sheet resistance thereof is adjusted to 0.1 (Ω/□) or less. The conductive shielding layer 40 has a thickness of a few μm to a few 10 μm (micrometers), preferably 1 to 90 μm.

Figure 2A:
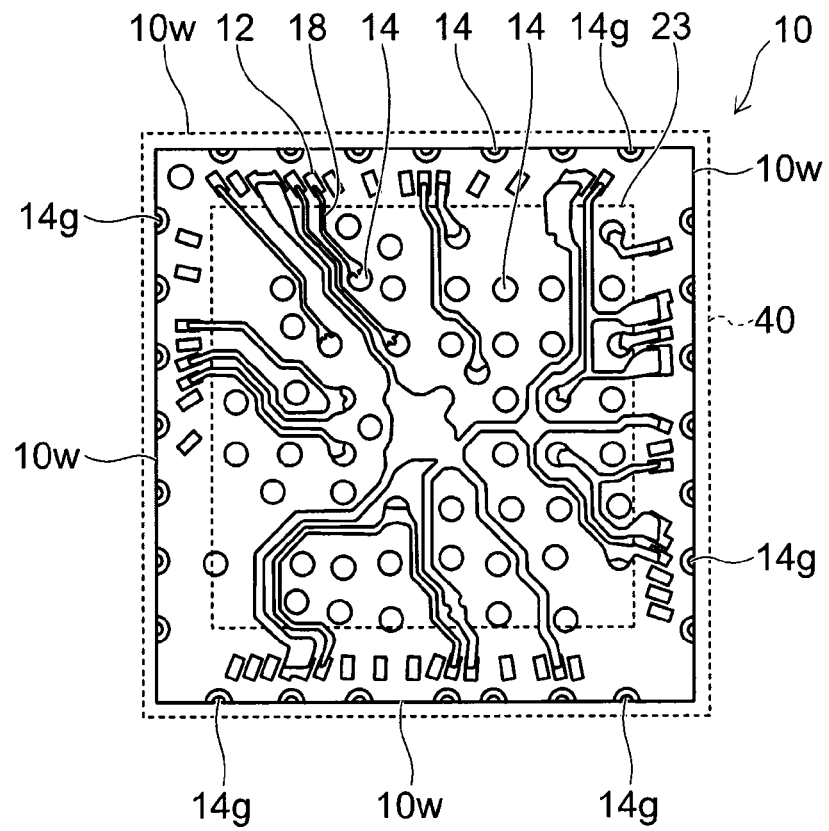
FIGS. 2A and 2B are schematic plan views of the semiconductor device according to the first embodiment.
Figure 2B:
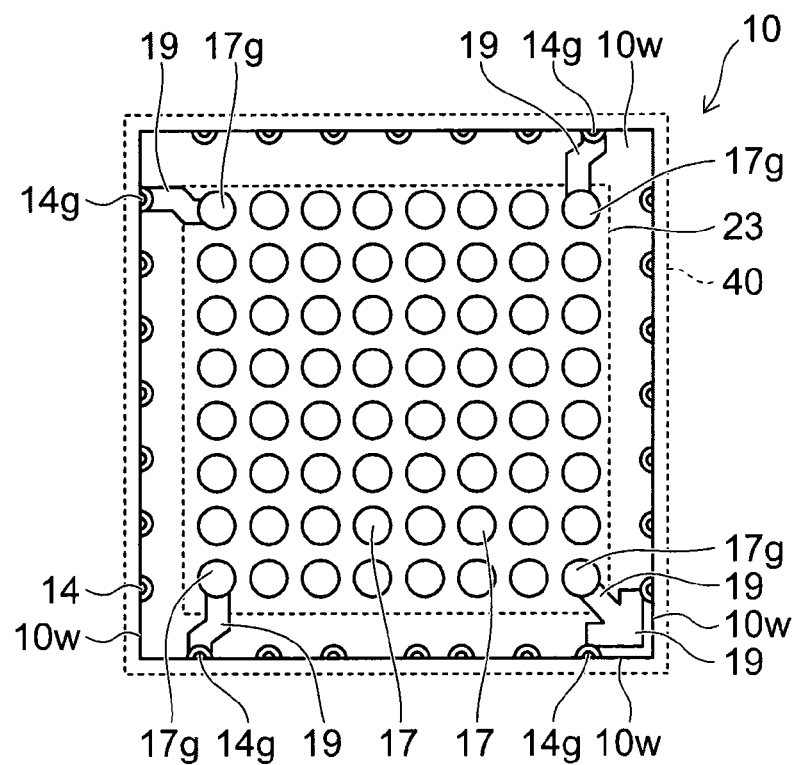

FIGS. 2A and 2B are schematic plan views of the semiconductor device according to the first embodiment, where FIG. 2A is a schematic plan view of the upper surface side of the circuit substrate, and FIG. 2B is a schematic plan view of the lower surface side of the circuit substrate. FIGS. 2A and 2B are views of the circuit substrate 10 as viewed from the direction perpendicular to the upper surface (or the lower surface) of the insulating layer 11.

As shown in FIG. 2A, the plurality of vias 14 are provided on the upper surface side of the circuit substrate 10. The plurality of vias 14 penetrate from the upper surface to the lower surface of the insulating layer 11. The rectangular region surrounded by reference numeral 23 is an element mounting region 23 for the semiconductor element 20. The via 14 is disposed in plural in the element mounting region 23 and/or outside the element mounting region 23. The plurality of interconnections 12 forming the first interconnection layers are provided outside the element mounting region 23. An extension line 18 is provided from the via 14 in the element mounting region 23 to the first interconnection layer 12. The extension line 18 is a signal line, a ground interconnection, etc. of the semiconductor element 20. The extension line 18 is copper (Cu) leaf, electrically conductive paste containing silver (Ag) and/or copper (Cu), or the like.

As shown in FIG. 2B, the plurality of external connection terminals 17 are provided on the lower surface side of the circuit substrate 10 in vertical and horizontal rows. Each of the plurality of external connection terminals 17 is electrically connected to the extension line 18 on the upper surface side via the via 14. That is, the external connection terminal 17 is electrically connected to the first interconnection layer 12 via the second interconnection layer 13, the via 14, and the extension line 18. Although the second interconnection layers 13 illustrated in FIG. 1 are not shown in FIG. 2B, the second interconnection layer 13 is actually in contact with the external connection terminal 17 (see FIG. 1).

In the semiconductor device 1, the group consisting of a plurality of external connection terminals 17 that are smaller in number than the plurality of external connection terminals 17 can become the ground potential. For example, after the semiconductor device 1 is mounted on the mounting substrate 100, some of the external connection terminals 17 become the ground potential by means of the ground interconnection provided in the mounting substrate 100. In the drawing, the external connection terminals that can become the ground potential are denoted by reference numeral 17g and referred to as external connection terminals 17g. In other words, the group consisting of a plurality of interconnections 13 forming second interconnection layers that are smaller in number than the plurality of interconnections 13 forming the second interconnection layers can become the ground potential. Furthermore, the second interconnection layer 13 in contact with the external connection terminal 17g can become the ground potential.

In FIG. 2B, the external connection terminals 17g (or the second interconnection layers 13 in contact with the external connection terminals 17g) that become the ground potential are located at the four corners of the element mounting region 23, respectively. In other words, each of the external connection terminals 17g (or the second interconnection layers 13 in contact with the external connection terminals 17g) is located at a corner of the semiconductor element.

In the circuit substrate 10, the group consisting of a plurality of vias 14 that are smaller in number than the plurality of vias 14 provided on the entire major surface of the circuit substrate 10 are disposed so as to be exposed at the side surface 10w of the circuit substrate 10. Each of the plurality of vias 14 disposed at the side surface 10w is cut at the side surface of the circuit substrate 10 by a dicing blade used in manufacturing processes, and has an exposed surface. In the semiconductor device 1, the exposed surface of each of the plurality of vias 14 disposed at the side surface 10w and the conductive shielding layer 40 are connected.

The extension line 19 extends from the external connection terminal 17g (or the second interconnection layer 13 in contact with the external connection terminal 17g) that becomes the ground potential. The extension line 19 is copper (Cu) leaf, electrically conductive paste containing silver (Ag) and/or copper (Cu), or the like.

The extension lines 19 are further connected to some of the plurality of vias 14 disposed at the side surface 10w. In FIG. 2B, the via connected to the extension line 19 is denoted by reference numeral 14g and referred to as a via 14g. Thereby, the plurality of vias 14g disposed at the side surface 10w of the circuit substrate 10 can become the ground potential.

In the semiconductor device 1, each of the external connection terminals 17g (or the second interconnection layers 13 in contact with the external connection terminals 17g) is electrically connected to each of a plurality of vias 14g that are further part of the vias 14 disposed at the side surface 10w; thereby, the conductive shielding layer 40 can become the ground potential. That is, in the semiconductor device 1, the contact between the conductive shielding layer 40 and the ground potential is provided in plural. The extension line 19 that supplies the ground potential to the via 14g may be provided on the upper surface side of the circuit substrate 10.

The number and arrangement of external connection terminals 17g (or second interconnection layers 13 in contact with external connection terminals 17g) that become the ground potential are not limited to the example described above. Another example is described below.

Figure 3A:
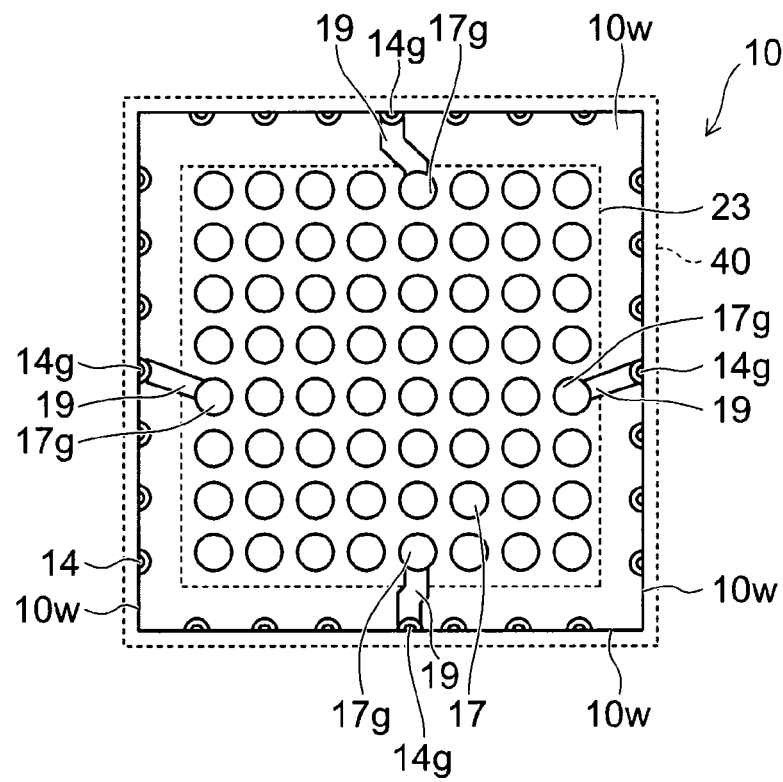
FIGS. 3A and 3B are schematic plan views of a semiconductor device according to the first embodiment.
Figure 3B:
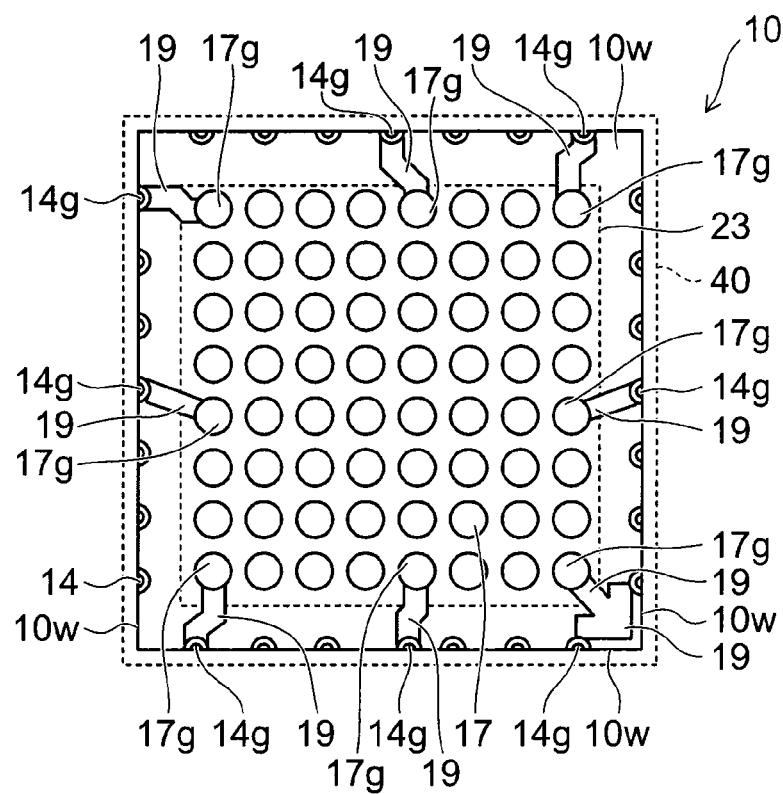

FIGS. 3A and 3B are schematic plan views of a semiconductor device according to the first embodiment, where FIG. 3A is a schematic plan view of a circuit substrate of a first modification example, and FIG. 3B is a schematic plan view of a circuit substrate of a second modification example. FIGS. 3A and 3B illustrate the lower surface side of the circuit substrate 10.

In the circuit substrate 10 shown in FIG. 3A, each of the external connection terminals 17g (or the second interconnection layers 13 in contact with the external connection terminals 17g) that become the ground potential is located in a central portion of one side of the element mounting region 23. In other words, each of the external connection terminals 17g (or the second interconnection layers 13 in contact with the external connection terminals 17g) is located between adjacent corners of the semiconductor element 20.

The extension line 19 extends from the external connection terminal 17g (or the second interconnection layer 13 in contact with the external connection terminal 17g) that becomes the ground potential. The extension lines 19 are further connected to a plurality of vias 14g disposed at the side surface 10w. The via 14g is connected to the conductive shielding layer 40.

In the circuit substrate 10 shown in FIG. 3B, the configuration of FIG. 2B and the configuration of FIG. 3A are combined. That is, each of the external connection terminals 17g (or the second interconnection layers 13 in contact with the external connection terminals 17g) that become the ground potential is located at a corner and/or between adjacent corners of the semiconductor element 20.

The distance between adjacent external connection terminals 17g (or adjacent second interconnection layers 13 in contact with external connection terminals 17g) is adjusted to not more than half the wavelength of the electromagnetic noise emitted from the semiconductor element 20 etc.

Next, manufacturing processes for the semiconductor device 1 are described.

FIGS. 4A to 4D are schematic cross-sectional views for describing manufacturing processes for the semiconductor device according to the first embodiment.

First, as shown in FIG. 4A, semiconductor devices 1 before fragmentation are formed. At this stage, the circuit substrate 10 is in a state before cutting, and the plurality of semiconductor devices 1 are connected.

Next, a dicing blade 90 is inserted into the circuit substrate 10 along a dicing line DL. At this stage, what is called half dicing is performed, and the dicing blade 90 is kept from reaching the lower surface side of the circuit substrate 10. That is, the insertion of the dicing blade 90 is stopped partway in the depth direction of the via 14 near the dicing line DL, and the via 14 exposes its cut surface obtained by cutting in the depth direction of the circuit substrate 10. This state is shown in FIG. 4B.

The cut surface of the via 14 does not necessarily need to be the center of the via 14, and part of the via 14 is included in the cut surface. To increase the contact area between the via 14 and the conductive shielding layer 40, the cut surface of the via 14 is preferably near to the center of the via 14.

Subsequently, the sealing resin layer 30 is cured, and then the conductive shielding layer 40 is put on the sealing resin layer 30 as shown in FIG. 4C. The conductive shielding layer 40 is buried also in a recess 90h formed by the half dicing.

The formation of the conductive shielding layer 40 is performed by, for example, the transfer method, screen printing method, spray application method, jet dispensing method, ink jet method, aerosol method, electroless plating method, electrolytic plating method, sputtering method, evaporation method, or the like.

By the conductive shielding layer 40 being buried in the recess 90h, the conductive shielding layer 40 comes into contact with the cut surface of the via 14. After that, the conductive shielding layer 40 is cured as necessary.

Next, as shown in FIG. 4D, dicing for fragmentation is performed to form the semiconductor device 1.

Effects of the semiconductor device 1 will now be described.

Figure 5A:
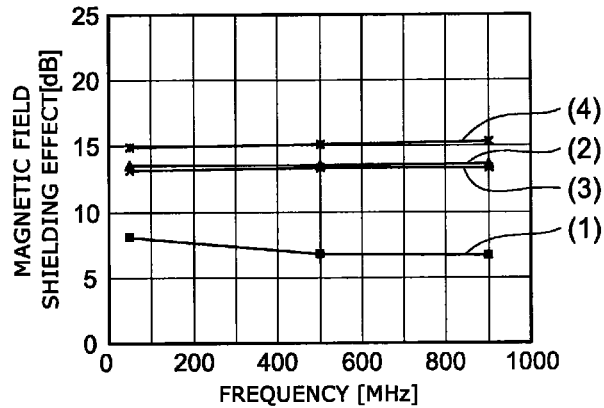
FIGS. 5A and 5B are simulation results for describing the shielding effect against electromagnetic noise.
Figure 5B:
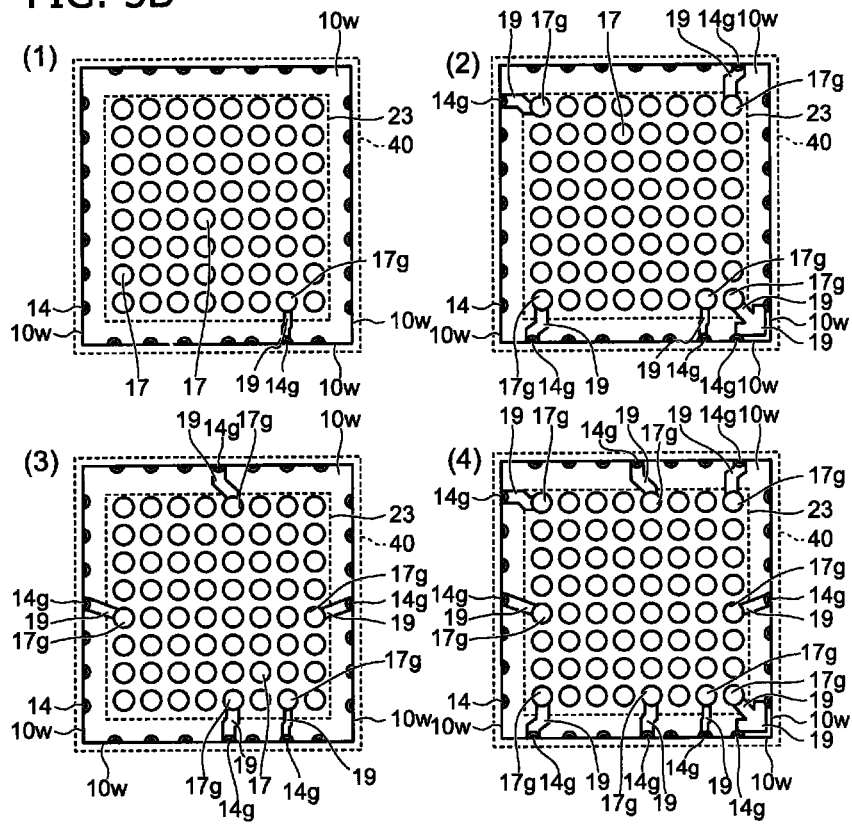

FIGS. 5A and 5B are simulation results for describing the shielding effect against electromagnetic noise.

The horizontal axis of FIG. 5A represents the noise frequency (MHz) emitted from the semiconductor element 20 etc., and the vertical axis represents the shielding effect (dB). The lines of (1) to (4) of FIG. 5A are simulation results by calculation based on the patterns of (1) to (4) of FIG. 5B, respectively.

In the pattern of (1), one external connection terminal 17g is connected with electrical continuity to the conductive shielding layer 40. That is, the number of positions where the conductive shielding layer 40 is in contact with the ground potential is one.

In the pattern of (2), in addition to the pattern of (1), further external connection terminals 17g disposed at the corners (four corners) of the semiconductor element 20 are connected with electrical continuity to the conductive shielding layer 40. That is, the number of positions where the conductive shielding layer 40 is in contact with the ground potential is five.

In the pattern of (3), in addition to the pattern of (1), further external connection terminals 17g disposed between adjacent corners of the semiconductor element 20 are connected with electrical continuity to the conductive shielding layer 40. That is, the number of positions where the conductive shielding layer 40 is in contact with the ground potential is five.

In the pattern of (4), in addition to the pattern of (1), further external connection terminals 17g disposed at the corners (four corners) of the semiconductor element 20 and between adjacent corners of the semiconductor element 20 are connected with electrical continuity to the conductive shielding layer 40. That is, the number of positions where the conductive shielding layer 40 is in contact with the ground potential is nine.

In a noise frequency range from 50 MHz to 900 MHz, the line of (1) exhibits 6 dB to 9 dB, whereas the lines of (2) and (3) exhibit increased values of 13 dB to 14 dB. Furthermore, the line of (4) exhibits increased values of approximately 15 dB. For example, at 900 MHz at which the noise frequency is highest, (2) and (3) are higher than (1) by approximately 6 dB, and (4) is higher than (1) by approximately 8 dB. Thus, the shielding effect improves as the number of positions where the conductive shielding layer 40 is in contact with the ground potential increases.

In the semiconductor device 1, since the vias 14 disposed at the side surface 10w of the circuit substrate 10 penetrate through the circuit substrate 10 in the thickness direction, the leakage of electromagnetic waves from the entire side surface of the circuit substrate 10 is suppressed.

Furthermore, in the semiconductor device 1, the position where the conductive shielding layer 40 is in contact with the ground potential is provided in plural, and the distance between the positions is adjusted to not more than half the wavelength of the electromagnetic noise emitted from the semiconductor element 20 etc. Therefore, electromagnetic noise can be more certainly shielded by the conductive shielding layer 40.

In the case where the number of positions where the conductive shielding layer 40 is in contact with the ground potential is only one, noise may easily leak from between the circuit substrate 10 and the conductive shielding layer 40. For example, when the semiconductor element 20 emits noise from a certain place, in the case where the certain place and the position where the conductive shielding layer 40 is in contact with the ground potential are away from each other, noise may easily leak from between the circuit substrate 10 and the conductive shielding layer 40.

In contrast, in the semiconductor device 1, the position where the conductive shielding layer 40 is in contact with the ground potential is provided in plural, and the conductive shielding layer 40 is set evenly at the ground potential. Thereby, electromagnetic noise can be more certainly shielded by the conductive shielding layer 40.

Second Embodiment

Figure 6:
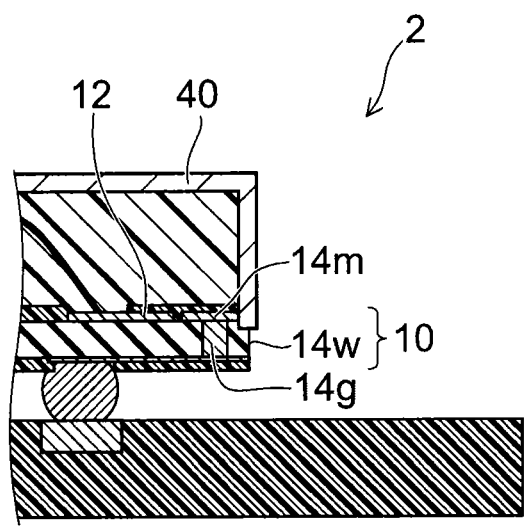
FIG. 6 is a schematic cross-sectional view of a semiconductor device according to a second embodiment.

FIG. 6 is a schematic cross-sectional view of a semiconductor device according to a second embodiment.

The basic structure of a semiconductor device 2 is the same as that of the semiconductor device 1. However, in the circuit substrate 10 according to the second embodiment, the via 14 provided at the side surface 10w of the circuit substrate 10 is not exposed at the side surface 10w of the circuit substrate 10. In the circuit substrate 10 according to the second embodiment, an interconnection layer 14m on the via 14g provided near the side surface 10w of the circuit substrate 10 is exposed at the side surface 10w of the circuit substrate 10. The interconnection layer 14m is made of the same material as the via 14g. The interconnection layer 14m in a land shape connected to the via 14g is connected to the conductive shielding layer 40. The interconnection layer 14m is electrically connected to the external connection terminal 17g (or the second interconnection layer 13 in contact with the external connection terminal 17g) that becomes the ground potential.

In other words, each of the external connection terminals 17g (or the second interconnection layers 13 in contact with the external connection terminals 17g) is electrically connected to the interconnection layer 14m at the side surface 10w; thereby, the conductive shielding layer 40 can become the ground potential. In the semiconductor device 2, the contact between the conductive shielding layer 40 and the ground potential is provided in plural via the interconnection layer 14m. Also the semiconductor device 2 thus configured provides similar effects to the semiconductor device 1.

Third Embodiment

Figure 7A:
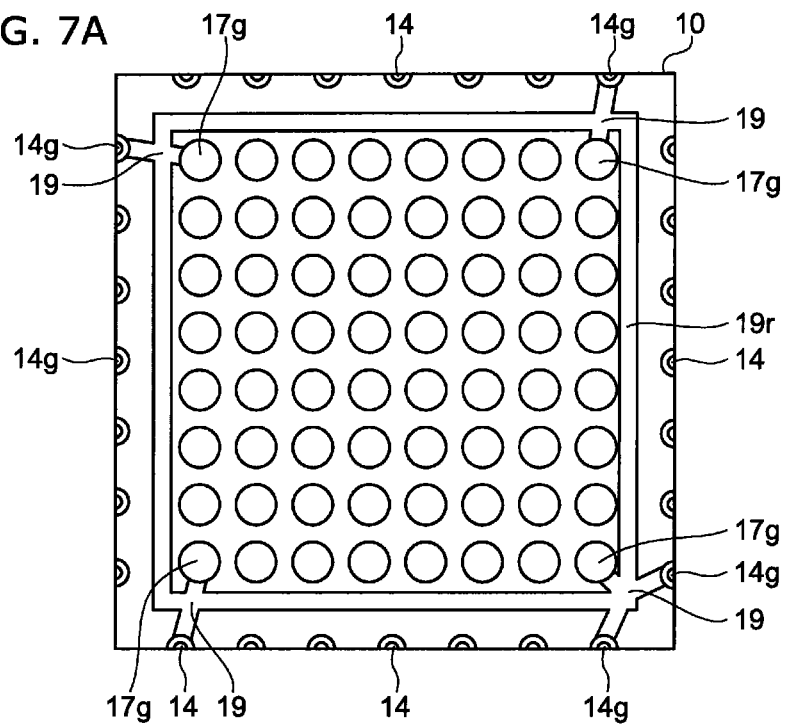
FIGS. 7A and 7B are a schematic plan view of a semiconductor device according to a third embodiment and a diagram for describing the shielding effect, respectively.
Figure 7B:
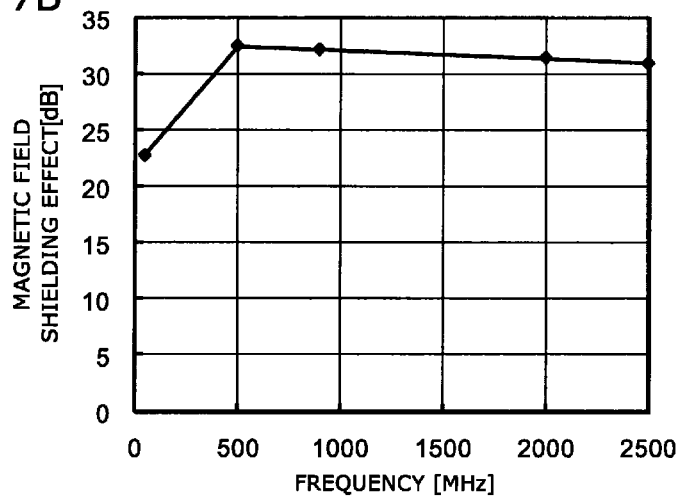

FIGS. 7A and 7B are a schematic plan view of a semiconductor device according to a third embodiment and a diagram for describing the shielding effect, respectively. FIG. 7A shows a schematic plan view of a circuit substrate of the semiconductor device, and FIG. 7B shows a diagram for describing the shielding effect.

FIG. 7A illustrates a plan view on the lower surface side of the circuit substrate 10.

In the circuit substrate 10 according to the third embodiment, as the second interconnection layer, an interconnection layer 19r in a ring shape is provided at the outer periphery of the external connection terminals 17 (or the second interconnection layers 13 in contact with the external connection terminals 17) arranged vertically and horizontally. That is, the circuit substrate 10 further includes the interconnection layer 19r in a ring shape surrounding the external connection terminals 17 (or the second interconnection layers 13 in contact with the external connection terminals 17) provided on the lower surface side of the insulating layer 11. The interconnection layer 19r is electrically connected to any of the external connection terminals 17g (or the second interconnection layers 13 in contact with the external connection terminals 17g).

For example, when the external connection terminal 17g becomes the ground potential, all of the interconnection layer 19r and the vias 14g become the ground potential.

The external connection terminal 17g and the interconnection layer 19r are effective when they are electrically connected with a spacing narrower than one half the wavelength of electromagnetic noise; and the narrower spacing they are connected with, the higher the shielding effect is. Furthermore, the interconnection layer 19r and the via 14g are effective when they are electrically connected with a spacing narrower than one half the wavelength of electromagnetic noise; and the narrower spacing they are connected with, the higher the shielding effect is. The interconnection layer 19r in a ring shape is effective when it has a line width of 0.035 mm or more, and widening the width to approximately 0.5 mm provides higher shielding effect against electromagnetic waves.

FIG. 7B shows the shielding effect in the case where the spacing between the external connection terminal 17g and the interconnection layer 19r is set to 1.6 mm or less, the spacing between the interconnection layer 19r and the via 14g is set to 0.4 mm, and the line width of the interconnection layer 19r is set to 0.5 mm. The horizontal axis represents the noise frequency (MHz) emitted from the semiconductor element 20 etc., and the vertical axis represents the shielding effect (dB).

In the circuit substrate according to the third embodiment, the magnetic field shielding effect is high as compared to the first and second embodiments.

Fourth Embodiment

Figure 8:
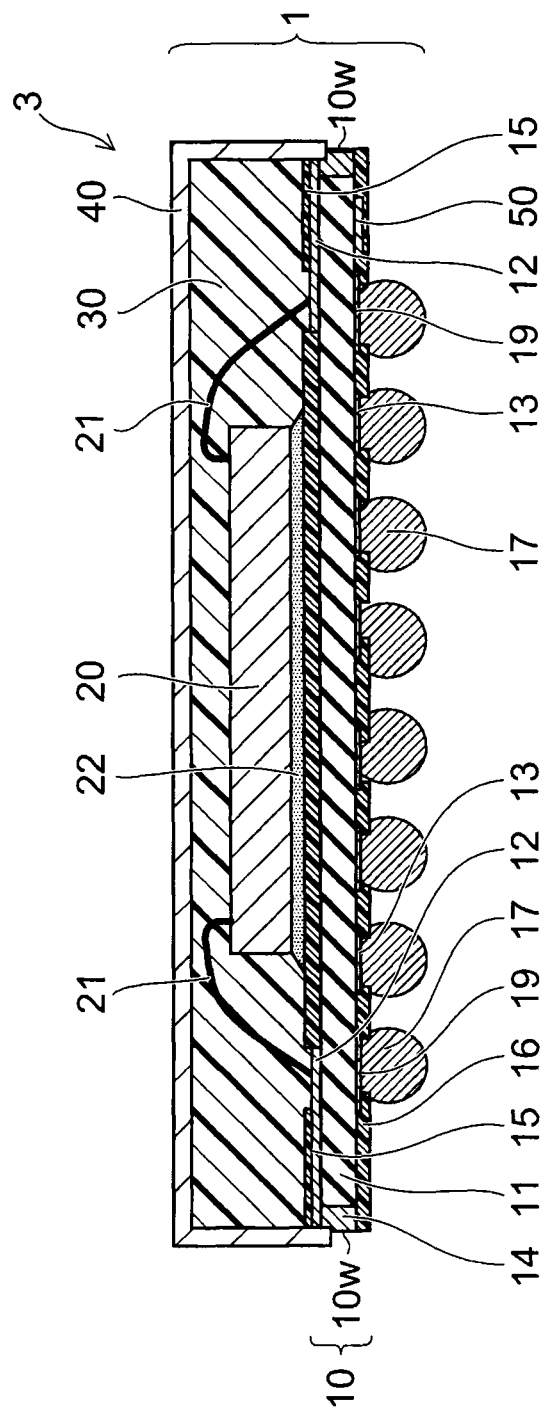
FIG. 8 is a schematic cross-sectional view of a semiconductor device according to a fourth embodiment.

FIG. 8 is a schematic cross-sectional view of a semiconductor device according to a fourth embodiment.

A semiconductor device 3 according to the fourth embodiment includes the circuit substrate 10. The circuit substrate 10 includes the insulating layer 11, the plurality of interconnections 12 forming the first interconnection layers provided on the upper surface side of the insulating layer 11, and the plurality of interconnections 13 forming the second interconnection layers provided on the lower surface side of the insulating layer 11. The semiconductor device 3 further includes the semiconductor element 20 mounted on the upper surface side of the circuit substrate 10, the sealing resin layer 30 sealing the semiconductor element 20 and provided on the upper surface of the circuit substrate 10, and the conductive shielding layer 40 covering the sealing resin layer 30 and part of the end portion of the circuit substrate 10.

In the semiconductor device 3, a plurality of interconnections 50 forming second interconnection layers that are different from the plurality of interconnections 12 forming the first interconnection layers and the plurality of interconnections 13 forming the second interconnection layers are provided in plural on the lower side of the circuit substrate 10. The plurality of interconnections 50 forming the second interconnection layers are not electrically connected to the conductive shielding layer 40, and are provided in a region on the lower surface side of the insulating layer 11 where the plurality of interconnections 13 forming the second interconnection layers are not provided. The plurality of interconnections 50 forming the second interconnection layers function as, for example, interconnections for plating when electrolytic plating processing of nickel (Ni), gold (Au), and/or the like is performed on the first interconnection layer 12 and the extension line 18 on the upper surface side of the circuit substrate 10. Therefore, the interconnection 50 of the second interconnection layer is electrically connected to any of the plurality of interconnections 12 forming the first interconnection layers.

By drawing the interconnection 50 of the second interconnection layer thus configured around on the lower side of the circuit substrate 10, the allowable margin of the interconnection design of the upper surface side of the circuit substrate 10 increases. Furthermore, since the plurality of interconnections 50 forming the second interconnection layers are provided on the lower side of the circuit substrate 10, the plurality of interconnections 50 forming the second interconnection layers and the conductive shielding layer 40 are not in contact (not connected with electrical continuity). Therefore, even if the interconnection 50 of the second interconnection layer exists after performing plating processing on the first interconnection layer 12 and the extension line 18, the interconnection 50 of the second interconnection layer and the conductive shielding layer 40 do not come into contact. That is, the interconnection 50 of the second interconnection layer does not need to be removed by an etching process, and a cost increase of the manufacturing processes is not caused. The plurality of interconnections 50 are drawn to the end of the circuit substrate 10 so as to be exposed at the side surface 10w.

Also in the semiconductor device 3, as shown in the drawing, the plurality of vias 14 penetrating from the upper surface to the lower surface of the insulating layer 11 are further provided in the circuit substrate 10, and a first group consisting of a plurality of vias smaller in number than the plurality of vias 14 may be exposed at the side surface 10w of the circuit substrate 10. In this case, each of the exposed surfaces of the vias 14 of the first group and the conductive shielding layer are connected. Some of the vias 14 exposed at the side surface 10w form the vias 14g that become the ground potential.

The external connection terminals 17 (17g) described in the first to fourth embodiments may be entirely removed as necessary; and also the semiconductor devices 1 to 3 of the LGA (Land Grid Array) structure in which each of the plurality of interconnections 13 forming the second interconnection layers is exposed on the lower surface side of the circuit substrate 10 are included in the embodiment.

Furthermore, out of the plurality of vias 14 disposed at the side surface 10w of the circuit substrate 10, those not electrically connected to the external connection terminal 17g may be removed as necessary. Also such a configuration is included in the embodiment.

Hereinabove, embodiments are described with reference to specific examples. However, the embodiment is not limited to these specific examples. That is, one skilled in the art may appropriately make design modifications to these specific examples, and such modifications also are included in the scope of the embodiment to the extent that the spirit of the embodiment is included. The components of the specific examples described above and the arrangement, material, conditions, shape, size, etc. thereof are not limited to those illustrated but may be appropriately altered.

Moreover, one skilled in the art may arrive at various alterations and modifications within the idea of the embodiment. Such alterations and modifications also should be seen as within the scope of the embodiment. Furthermore, the components of the embodiments may be combined within the extent of technical feasibility, and combinations of them also are included in the scope of the embodiment to the extent that the spirit of the embodiment is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. An electronic device comprising:
a circuit substrate including an insulating layer, a plurality of interconnections provided on the insulating layer, and a copper layer or a tungsten layer, and sections of one of the copper layer and the tungsten layer being exposed at the side surface of the circuit substrate;
an electronic element mounted on the circuit substrate;

bonding wires electrically connecting the electronic element and at least one of the plurality of interconnections;

a sealing resin layer sealing the electronic element and the bonding wires;

a conductive shielding layer covering the sealing resin layer, and an external connection terminal connected to the interconnections, the sections and the conductive shielding layer being electrically connected, one of the interconnections and the external connection terminal connected to one of the interconnections being capable of becoming a ground potential, the interconnection capable of becoming the ground potential being electrically connected to the sections, a distance between the adjacent sections capable of becoming the ground potential being not more than a half of a wavelength of an electromagnetic wave to be shielded.

2. The device according to claim 1, wherein the circuit substrate including a solder resist layer between the electronic element and the insulating layer.

3. The device according to claim 1, wherein at least one of the sections capable of becoming the ground potential is positioned at a position where the conductive shielding layer is in contact with the ground potential.

4. The device according to claim 2, wherein a die bonding material is provided between the electronic element and the solder resist layer.

5. The device according to claim 1, further comprising an interconnection layer provided on a lower side of the circuit substrate, the interconnection layer surrounds the external connection terminal, and the interconnection layer is in contact with the external connection terminal capable of becoming the ground potential.

6. The device according to claim 5, wherein a distance between the external connection terminal capable of becoming the ground potential and the interconnection layer is shorter than a half of the wavelength of the electromagnetic wave to be shielded.

7. An electronic device comprising:

a circuit substrate including an insulating layer, a plurality of interconnections provided on the insulating layer, and a copper layer or a tungsten layer, and sections of one of the copper layer and the tungsten layer being exposed at the side surface of the circuit substrate;

an electronic element mounted on the circuit substrate;

bonding wires electrically connecting the electronic element and at least one of the plurality of interconnections;

a sealing resin layer sealing the electronic element and the bonding wires;

a conductive shielding layer covering the sealing resin layer; and an external connection terminal connected to the interconnections, the sections and the conductive shielding layer being electrically connected, one of the interconnections and the external connection terminal connected to one of the interconnections being capable of becoming a ground potential, the interconnection capable of becoming the ground potential being electrically connected to the sections, a distance between the adjacent sections capable of becoming the ground potential being not more than a half of a wavelength of an electromagnetic wave, and the wavelength being not less than 50MHz and not more than 2.5GHz.

* * * * *